United States Patent [19]

Rumennik et al.

[11] Patent Number: 5,258,636
[45] Date of Patent: Nov. 2, 1993

[54] NARROW RADIUS TIPS FOR HIGH VOLTAGE SEMICONDUCTOR DEVICES WITH INTERDIGITATED SOURCE AND DRAIN ELECTRODES

[75] Inventors: Vladimir Rumennik, Los Altos; Robert W. Busse, Mountain View, both of Calif.

[73] Assignee: Power Integrations, Inc., Mountain View, Calif.

[21] Appl. No.: 808,024

[22] Filed: Dec. 12, 1991

[51] Int. Cl.$^5$ ............... H01L 29/80; H01L 29/520; H01L 29/784
[52] U.S. Cl. ................... 257/339; 257/341; 257/343
[58] Field of Search .............. 357/23.1, 23.8; 257/401, 409, 328, 335, 336, 339, 341, 342, 343, 356

[56] References Cited

U.S. PATENT DOCUMENTS

| | | | |
|---|---|---|---|
| 4,462,041 | 7/1984 | Glenn | 357/23.14 |
| 4,811,075 | 3/1989 | Eklund | 357/23.8 |
| 4,894,694 | 1/1990 | Cham et al. | 357/23.3 |
| 5,025,296 | 6/1991 | Fullerton et al. | 357/23.8 |
| 5,040,045 | 8/1991 | McArthur | 257/341 |
| 5,068,700 | 11/1991 | Yamaguchi et al. | 357/23.8 |

FOREIGN PATENT DOCUMENTS

| | | | |
|---|---|---|---|
| 0038867 | 4/1981 | Japan | 357/23.8 |
| 0012557 | 1/1982 | Japan | 357/23.8 |
| 0012558 | 1/1982 | Japan | 357/23.8 |
| 0064771 | 4/1985 | Japan | 357/23.8 |

OTHER PUBLICATIONS

M. Amato, "Reduced Electric Field Crowding at the Fingertips of Lateral DMOS Transistors," *Proceedings of the Electrochemical Society Meeting*, May 1989, pp. 161–162.

Hamza Yilmaz, "Modeling and Optimizing of Lateral High Voltage IC Devices to Minimize 3-D Effects," *Proceedings of the Electrochemical Society Meeting*, May 1989, pp. 155–156.

*Primary Examiner*—Folf Hille
*Assistant Examiner*—Peter Toby Brown
*Attorney, Agent, or Firm*—Thomas E. Schatzel

[57] ABSTRACT

A field effect transistor (FET), according to the present invention, comprises a source and drain pair of electrodes having non-uniform charge distributions between them, such as results from small radius tips, and has a gate and channel structure that exists only between points of the source and drain pair that have the less intense charge distributions, e.g., areas not involving any small radius tips. The gate and channel structure is such that, given the non-uniform charge distributions between the source and drain pair of electrodes, the electric field is reduced around the tip by eliminating the n-well junction near the source-drain fingertips.

2 Claims, 3 Drawing Sheets

NARROW RADIUS TIPS FOR HIGH VOLTAGE SEMICONDUCTOR DEVICES WITH INTERDIGITATED SOURCE AND DRAIN ELECTRODES

BACKGROUND OF THE INVENTION

1. Field of the Invention

The present invention relates to semiconductors, and more particularly to structures that improve on the breakdown voltage between source and drain in field effect transistors and other semiconductors.

2. Description of the Prior Art

Sharp edges and especially points in conductors have long been known to collect charges that can become high enough to result in a current that will jump a vacuum-surface barrier. This phenomenon is usefully employed in microelectronic vacuum field emission devices that promote an electron flow from a non-heated semiconductor cathode. In field emission devices, anode and gate voltages as low as 100 volts are enough to result in emission from the micron sized radius at the apex of cone-shaped cathodes.

However, in other devices, the charge concentrations in small radius tips of conductors can lead to undesirable consequences. Considering high voltage field effect transistors (FET), they have a source, a drain, and a channel between them. If the source or drain is not round, charges can concentrate in any projections facing the direction of the opposite electrode. In a FET, charge concentrations can lead to reduced breakdown voltage ratings. For a general background on this subject, refer to M. Amato, "Reduced Electric Field Crowding at the Fingertips of Lateral DMOS Transistors," *Proceedings of the Electrochemical Society Meeting*, May 1989, pp. 161-162; and Hamza Yilmaz, "Modeling and Optimizing of Lateral High Voltage IC Devices to Minimize 3-D Effects," *Proceedings of the Electrochemical Society Meeting*, May 1989, pp. 155-156. Every channel will have a finite amount of voltage standoff to breakdown currents. The electric field concentrations will be greatest at any sharp tips in the source and/or drain. To combat this, the prior art has rounded off wide pointed structures. An example of this is shown in a FET 10 in FIGS. 1 and 2, which illustrate a portion of a FET.

FET 10 has a source electrode 12 in the shape of a line segment and a horse shoe-shaped drain electrode 14 that encircles one end of the source electrode 12. Electrode 12 has a diffusion 16 and electrode 14 has a diffusion 18 in a substrate 20. A polysilicon gate electrode 22 is insulated from the underlying silicon channel by a gate silicon oxide 24. In the prior art, such as FET 10, a channel comprising an n−drift region 26 uniformly surrounds both sides and the one end of the source 12 and has a p-top layer 27 that tops an extended drain structure. The width of the channel is roughly equal all around the source 12. The channel current could therefore be expected to be equally distributed. It has been observed that breakdown current flow occurs at the small radius tip of the source when a device is overvoltage stressed, e.g., a tip 28 in FIG. 1. To counteract this, prior art devices deliberately increase the width of the source, in order to increase the radius of the tip 12. Though this measure tends to improve the breakdown voltage rating, it also requires that the transistor be much larger. Typically, the n-well 18 radius near the gate will be about fifty microns with a drift 26 length of eighty microns for a 1,000 volt rated device.

With the current trend toward smaller devices, the prior art method of increasing the tip radii is unacceptable.

SUMMARY OF THE PRESENT INVENTION

It is therefore an object of the present invention to provide a semiconductor device that is smaller in size than a comparable device with the same breakdown voltage.

Briefly, a first embodiment of the present invention is a field effect transistor (FET), presented in its lateral configuration, having, from a top view, a finger shaped source electrode surrounded by a horseshoe-shaped drain electrode. At the tip of the finger of the source, and within the inside curve of the drain, the traditional drain n-well and p-top, which comprise the n−drift region, have been eliminated. In other words, there is no drain extension between the source and the n+drain in this area. A conventional channel area does exist in the areas between the source and drain where they are parallel to one another. A charge that unavoidably collects at the tip of the source has an electrically much wider source-drain gap, the FET therefore exhibits much higher breakdown voltages. The improved breakdown voltage characteristic is thus taken advantage of in this first embodiment by reducing the tip radius of the source and scaling down the overall size of the FET.

An advantage of the present invention is that it provides semiconductor devices of higher breakdown voltages compared to similarly sized prior art devices.

Another advantage of the present invention is that FETs with comparative breakdown voltages to those of the prior art can be made substantially smaller.

Another advantage of the present invention is that the FET capacitances decrease as the device becomes smaller.

These and other objects and advantages of the present invention will no doubt become obvious to those of ordinary skill in the art after having read the following detailed description of the preferred embodiments which are illustrated in the various drawing figures. Though the above considerations are given to the source fingertip structure of an n-channel FET, similar arrangements are equally well applied to the drain fingertip and p-channel devices.

IN THE DRAWINGS

DETAILED DESCRIPTION OF THE EMBODIMENTS

Figure 1:
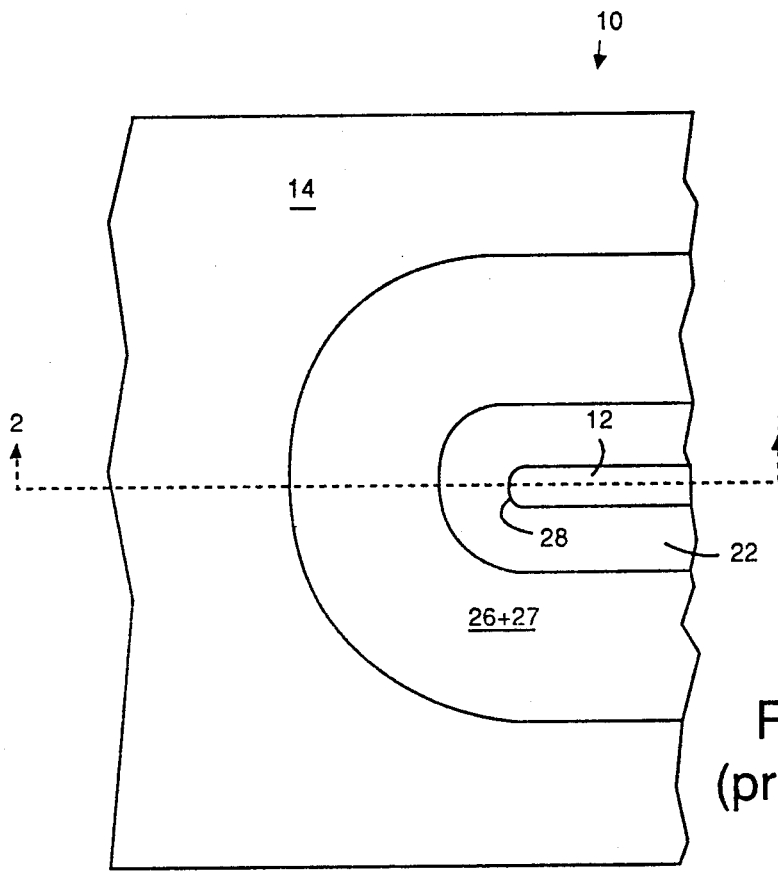
FIG. 1 is a partial top view of a prior art FET.
Figure 3:
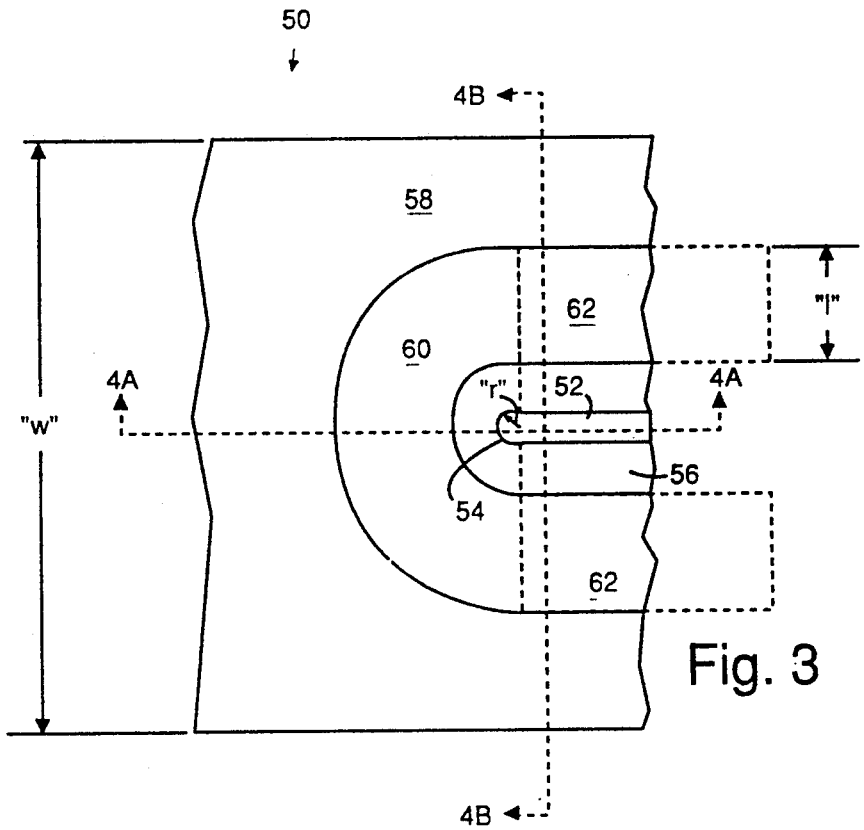
FIG. 3 is a partial top view of a FET made according to the present invention. The smaller size of FETs possible with the present invention is represented by the size differences of the FET of FIGS. 1-2 with the FET of FIGS. 3-4.
Figure 4A:
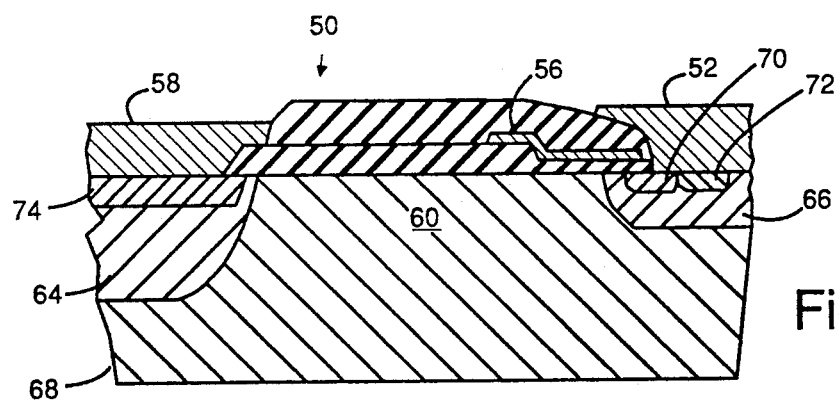
FIG. 4A is a cross-sectional view of the FET of FIG. 3 taken along line 4A—4A.
Figure 4B:
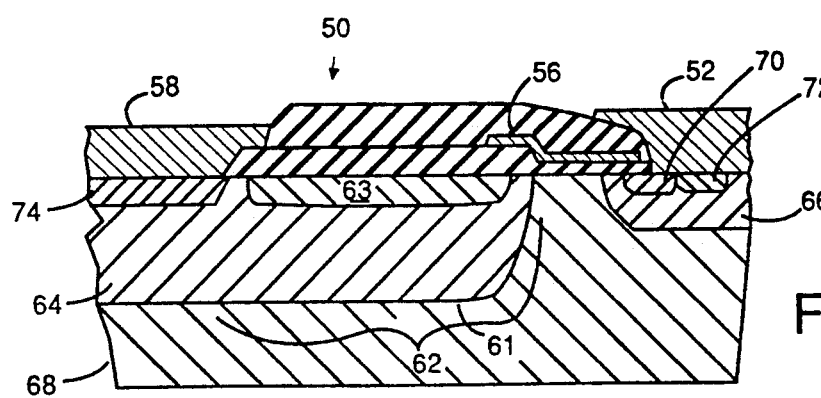
FIG. 4B is a cross-sectional view of the FET of FIG. 3 taken along line 4B-4B.

A field effect transistor (FET) 50, according to an embodiment of the present invention, is illustrated in FIGS. 3 and 4. Known in the alternative as a high voltage metal oxide semiconductor (MOS) transistor, FET 50 is comprised of a source 52 having a tip 54, a gate 56, a drain 58, an area 60 lacking an n⁻drift diffusion, an n⁻drift region 61 in an extended drain area 62 that includes a p-top layer 63 on each lateral side of source 52, an n-well 64 associated with the drain 58, a p-well 66 for the source 52, and a p-type substrate 68. Source 52 comprises a metal in contact with an n+region 70 and p⁻region 72 in well 66. Drain 58 comprises a metal in contact with n+region 74 in n-well 64. Gate 56 is comprised of polysilicon, and the insulating layers above and below it are comprised of silicon dioxide. Other materials common in the art may also be suitable. Tip 54 has a radius much smaller than tip 28 (FIG. 1). Therefore the overall geometry of FET 50 is much smaller than that of FET 10. Typically, tip 28 will have a radius of 50-75 microns, while tip 54 radius "r" is on the order of about ten microns.

The outside width "w" of drain 58 can therefore be reduced two times the difference in radius "r". In this example, that would be, at a minimum, two times forty microns, for a total of an eighty micron reduction in FET 50. A typical resulting width "w" for a 1,000 volt FET would be 40%-50% smaller. The drift length "l" can be reduced to 65 microns from eighty microns. As an additional benefit, the "on" resistance (Ron) is improved with no degradation in breakdown voltage. FET 50 is merely an example for purposes of this discussion, and its size or layout should not be considered as limiting the present invention.

U.S. Pat. No. 4,811,075, issued Mar. 7, 1989, to Eklund, may be helpful to the reader in understanding the general structure and fabrication of high voltage MOS transistors. The teachings of Eklund are therefore incorporated here to the extent that they are necessary to help one skilled in the art to construct a device of the present invention.

Figure 2:
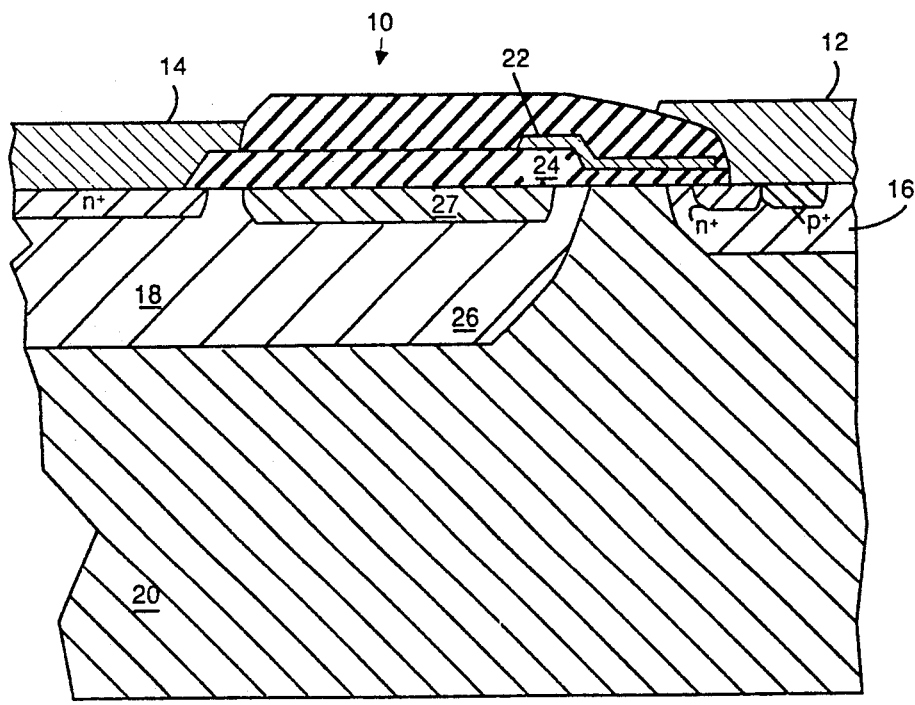
FIG. 2 is a cross section of the FET of FIG. 1, taken along the line 2—2.

In FET 50 (FIGS. 3 and 4), area 60 is unique. In the prior art it would comprise a normal channel cross-section, such as in FIG. 2. But in FET 50, the extension of n-well 64 beneath gate 56 has been reduced or eliminated and extends only under drain 58. The p-top of FIG. 2 is also absent from FET 50 in area 60. The vertical dotted line in FIG. 3 represents the boundary between area 60 and n⁻drift area 62. Above and below source 52, looking at it from FIG. 3, a "normal" channel area exists, in areas 62. As such, the normal channel areas will resemble that of FIG. 2. The difference between areas 60 and 62 is that, in area 60, a much higher voltage will be necessary to cause a breakdown between n-well 64 and p-well 66, compared to area 62. Taking advantage of this, tip 54 has a very small radius "r" (e.g., ten microns) and the overall geometry of FET 50 is reduced. Preferably, the structure is such that any breakdown that does occur will happen in normal channel areas 62 where charge concentrations are minimum. The result of this is that FET 50 has both small overall geometry and a relatively high breakdown voltage characteristic.

Another way of understanding the present invention and embodiments that are possible from it is to view the electrodes in a transistor as having non-uniform charge distributions that result from the shapes of the electrodes and their orientations relative to one another. The functioning of a channel existing between such electrodes will more-or-less be uniform across its length. But the probability of a breakdown across a particular part of the channel is directly related to the charge distributions. Therefore, any combination of shapes of electrodes, channel, and their relative orientations that results in a wider or absent channel between points of high charge concentration in the electrodes will be in accordance with the present invention.

Alternatively, conductive features within semiconductor devices, such as integrated circuits, that have sharp tips separated from other conductive layers by a dielectric, can have thicker dielectric insulation deposited in those areas proximate to the tips. For example, the sharp end of an electrode normally in contact with a channel diffusion can be tipped in a dielectric.

The present invention also embraces shaping a drain electrode to saddle a source electrode so that either end of the source electrode are away from the drain electrode. The channel exists therefore only inside the saddle, between the portions of the electrodes that are essentially parallel to one another.

The above discussion has described various electrodes by calling them either a source or a drain. The present invention can nevertheless hold true when these roles are reversed. It also holds true for either p-channel or n-channel FETs, in spite of the fact that only one of those types has been described here in detail.

Figure 5:
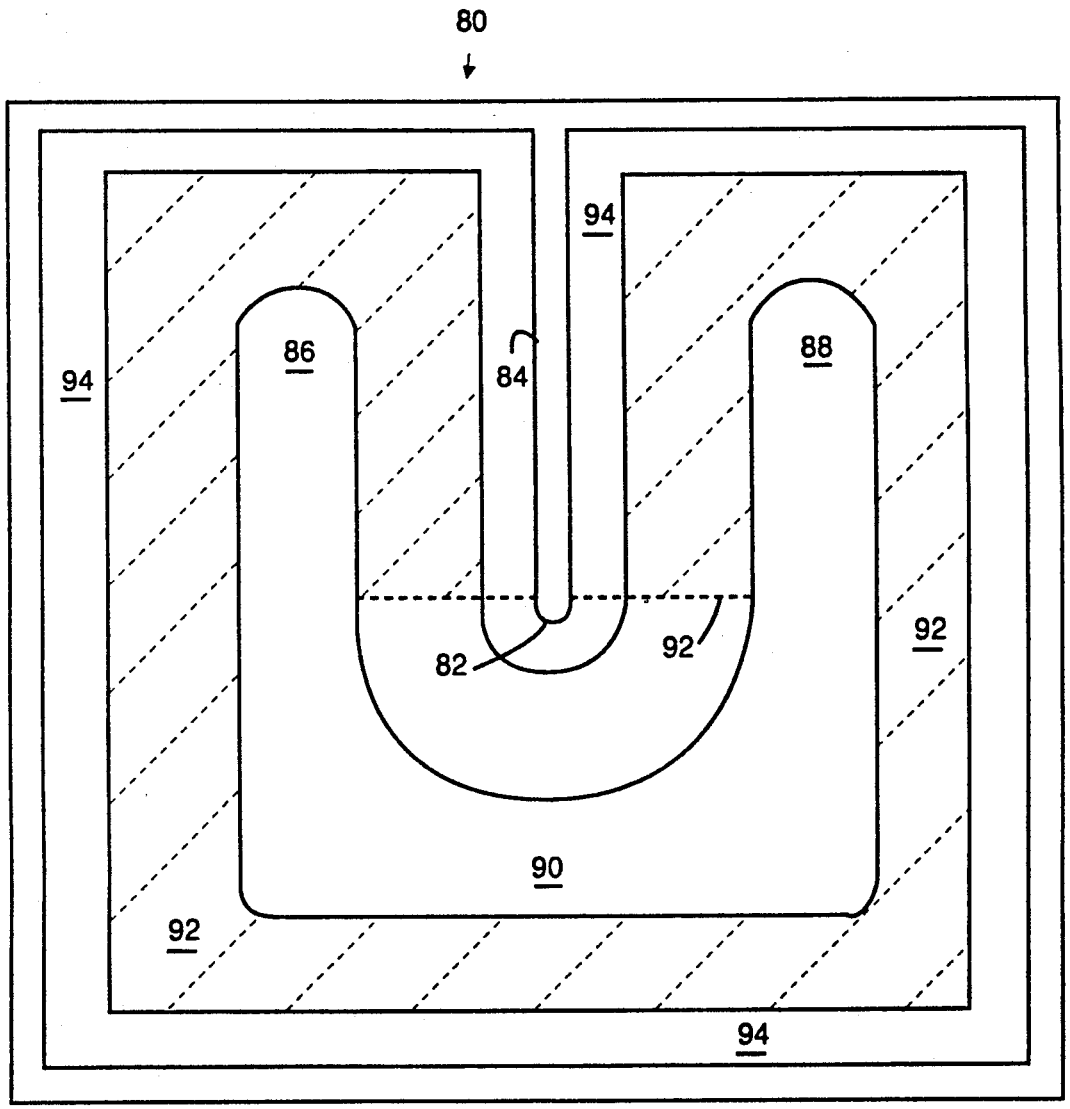
FIG. 5 is an elevational view of a high-voltage MOS transistor with interdigitated source and drain fingertips.

FIG. 5 illustrates a high voltage MOS transistor 80 having interdigitated source and drain fingertips, the shapes of the fingertips can be such that lateral electrical fields can sum within the plane of the surface, and if otherwise not compensated for, that will limit, the breakdown voltage. When using an interdigitated layout, fingertips are unavoidable.

FIG. 5 illustrates a high-voltage MOS transistor embodiment of the present invention, referred to by the general reference numeral 80. Transistor 80 has a source fingertip 82 included in a source electrode 84 and a pair of drain fingertips 86 and 88 that are included in a drain electrode 90. Fingertips 82, 86 and 88 are thus interdigitated. The drain 90 has a lightly doped drain diffusion (LDD) 92 that extends under a gate structure 94. The LDD 92 is absent only around the source fingertip 82, leaving only substrate in that area. The absence of the LDD area around the fingertip of the source is such that the absence of a junction there prevents the crowding at the gate of an electric field.

Although the present invention has been described in terms of the presently preferred embodiments, it is to be understood that the disclosure is not to be interpreted as limiting. The present invention should be applicable to all structures with drift regions built in the above manner. The technique has been demonstrated in a technology which uses an additional p⁻layer in the n⁻layer to aid in the depletion of the n⁻drift region. It will also be applicable to other technologies which use only n⁻drift region without the additional p⁻layer. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A field effect transistor, comprising:

a source structure that terminates in a fingertip and includes a metal in contact with an n+diffusion and a p−diffusion in a wall diffusion;

a drain structure that interdigitates with and engulfs the source structure proximate to said fingertip and includes a metal in contact with an n+diffusion in an n-well diffusion;

a gate structure disposed on a field effect channel between the source and drain structures; and an extended drain including a lateral n−drift layer and an overlying p-top layer and connected to the drain structure and extending into said channel from the drain structure to beneath the gate structure except in an area of said channel proximate to said fingertip of the source structure where the extended drain is not extended into said channel farther than the drain structure wherein the breakdown voltage of the device is increased by virtue of the extended drain not extending into said channel proximate to said fingertip.

2. A field effect transistor, comprising:

a source structure that terminates in a fingertip having a radius at said fingertip of approximately ten microns;

a drain structure that interdigitates with and engulfs the source structure proximate to said fingertip and wherein the source and drain structures are separated by approximately sixty-five microns;

a gate structure disposed on a field effect channel between the source and drain structures; and an extended drain connected to the drain structure and extending into said channel from the drain structure to beneath the gate structure except in an area of said channel proximate to said fingertip of the source structure where the extended drain is not extended into said channel farther than the drain structure wherein the breakdown voltage of the device is increased by virtue of the extended drain not extending into said channel proximate to said fingertip.

* * * * *